(12) United States Patent
Zhang et al.

(10) Patent No.: US 10,361,271 B2
(45) Date of Patent: Jul. 23, 2019

(54) SEMICONDUCTOR DEVICE AND METHOD OF MANUFACTURING THE SAME

(71) Applicant: Gpower Semiconductor, Inc., Suzhou (CN)

(72) Inventors: Naiqian Zhang, Suzhou (CN); Feihang Liu, Suzhou (CN); Yi Pei, Suzhou (CN)

(73) Assignee: GPOWER SEMICONDUCTOR, INC., Suzhou (CN)

(*) Notice: Subject to any disclaimer, the term of this patent is extended or adjusted under 35 U.S.C. 154(b) by 95 days.

(21) Appl. No.: 15/388,817

(22) Filed: Dec. 22, 2016

(65) Prior Publication Data

US 2017/0104063 A1   Apr. 13, 2017

Related U.S. Application Data

(63) Continuation of application No. PCT/CN2014/091422, filed on Nov. 18, 2014.

(30) Foreign Application Priority Data

Nov. 6, 2014   (CN) .......................... 2014 1 0619182

(51) Int. Cl.
| | | |
|---|---|---|
| *H01L 29/06* | (2006.01) |
| *H01L 23/48* | (2006.01) |
| *H01L 23/528* | (2006.01) |
| *H01L 29/08* | (2006.01) |
| *H01L 29/778* | (2006.01) |
| *H01L 29/417* | (2006.01) |
| *H01L 29/423* | (2006.01) |
| *H01L 29/16* | (2006.01) |
| *H01L 29/20* | (2006.01) |
| *H01L 29/24* | (2006.01) |

(52) U.S. Cl.
CPC ........ *H01L 29/0696* (2013.01); *H01L 23/481* (2013.01); *H01L 23/5286* (2013.01); *H01L 29/0847* (2013.01); *H01L 29/41758* (2013.01); *H01L 29/42316* (2013.01); *H01L 29/778* (2013.01); *H01L 29/16* (2013.01); *H01L 29/1602* (2013.01); *H01L 29/1608* (2013.01); *H01L 29/20* (2013.01); *H01L 29/2003* (2013.01); *H01L 29/24* (2013.01); *H01L 29/4175* (2013.01); *H01L 2924/0002* (2013.01)

(58) Field of Classification Search
CPC ... H01L 23/48; H01L 23/481; H01L 23/5286; H01L 29/0696; H01L 29/0847; H01L 29/778; H01L 28/40; H01L 28/20; H01L 28/10; H01L 29/7408
See application file for complete search history.

(56) References Cited

U.S. PATENT DOCUMENTS 6,384,701 B1* 5/2002 Yamada .................. H01L 23/66
257/664
6,396,096 B1* 5/2002 Park .................. H01L 27/10808
257/296

(Continued)

*Primary Examiner* — Ahmed N Sefer
(74) *Attorney, Agent, or Firm* — Flener IP & Business Law; Zareefa B. Flener

(57) ABSTRACT

A semiconductor device comprises an active region and a passive region located outside the active region. The active region comprises a plurality of active region units. At least one pair of adjacent active region units do not completely overlap in a length direction of the semiconductor device.

20 Claims, 10 Drawing Sheets

(56) References Cited

U.S. PATENT DOCUMENTS

| | | | | |
|---|---|---|---|---|
| 6,980,454 B2* | 12/2005 | Fujino | ............ | G11C 7/12 |
| | | | | 365/230.03 |
| 2001/0006834 A1* | 7/2001 | Hirota | ............ | H01L 27/10894 |
| | | | | 438/244 |
| 2002/0109205 A1* | 8/2002 | Sawada | ............ | H01L 23/5223 |
| | | | | 257/532 |
| 2003/0205732 A1* | 11/2003 | Parks | ............ | H01L 23/522 |
| | | | | 257/200 |
| 2004/0173829 A1* | 9/2004 | Kim | ............ | H01L 27/11502 |
| | | | | 257/295 |
| 2005/0160389 A1* | 7/2005 | Arai | ............ | G06F 17/5068 |
| | | | | 716/120 |
| 2008/0137408 A1* | 6/2008 | Roizin | ............ | G11C 16/0441 |
| | | | | 365/185.1 |
| 2012/0228625 A1* | 9/2012 | Ikeda | ............ | H01L 27/0605 |
| | | | | 257/76 |
| 2014/0183544 A1* | 7/2014 | Takatani | ............ | H01L 29/2003 |
| | | | | 257/76 |
| 2015/0311332 A1* | 10/2015 | Zhang | ............ | H01L 24/06 |
| | | | | 257/76 |

* cited by examiner

SEMICONDUCTOR DEVICE AND METHOD OF MANUFACTURING THE SAME

CROSS-REFERENCE TO RELATED APPLICATIONS

This application is a continuation of international application No. PCT/CN2014/091422 filed on Nov. 18, 2014, which claims the benefit and priority of Chinese patent application No. 201410619182.0 filed on Nov. 6, 2014. Both applications are incorporated herein in their entirety by reference.

TECHNICAL FIELD

The disclosed embodiments relate to semiconductor technology, and more particularly to a semiconductor device and a method of manufacturing the same.

BACKGROUND

Due to advantages of the large band gap, high electron mobility, high breakdown field strength and high temperature resistance, GaN semiconductor devices are suitable for manufacture of electronic devices with high temperatures, high voltages, high frequencies and high powers, and thus have broad application prospects.

FIG. 1 is a schematic top view illustrating a gallium nitride semiconductor device of the prior art. Referring to FIG. 1, a gallium nitride semiconductor device of the prior art comprises an active region a' which is an enclosed area and a passive region b' which is located outside the active region a'. Source electrodes 11', drain electrodes 12' and gate electrodes 13' located in the active region a' are repeatedly arranged in a width direction of the device, so as to form a multi-finger structure. The whole semiconductor device is rectangular in plan view. The repeatedly arranged drain electrodes 12' are connected together through a drain interconnection metal 14' located in the passive region b', the repeatedly arranged gate electrodes 13' are connected together through a gate interconnection metal 131', and the semiconductor device receives signals from the outside through lead pads 15'.

The gallium nitride semiconductor device has a very high power density, thus has a very high heat density, so that a large amount of heat is generated during operation of the gallium nitride semiconductor device. If the generated heat cannot be dissipated in time, an internal temperature of the gallium nitride semiconductor device will rise, which affects stability and reliability of the device and limits an output power of the device. In addition, in the gallium nitride semiconductor device of the prior art, the active region a' occupies the most area of the device, thus it is difficult to promptly transfer heat generated in a central region of the gallium nitride semiconductor device through lateral paths, while the thermal conductivity through longitudinal paths is saturated. Therefore, the gallium nitride semiconductor device will have a relatively high temperature in the central region and a relatively low temperature in its edges, i.e., there is a nonuniform temperature distribution, which degrades performances of the gallium nitride semiconductor device and reduces the reliability thereof.

FIG. 2 is a schematic top view illustrating a gallium nitride semiconductor device of the prior art with an increased heat dissipation area. Referring to FIG. 2, a gallium nitride semiconductor device has an increased space between gate electrodes 13'. By increasing a width of the whole gallium nitride semiconductor device to increase the heat dissipation area, heat dissipation is improved. However, the whole gallium nitride semiconductor device is very wide and thus has a large width-length ratio, which results in some disadvantages such as increased difficulty in the subsequent processes such as cutting and packaging etc., decreased yield and reduced performances such as increased gate resistance or desynchronized radio-frequency signal phases. Furthermore, it is still difficult to dissipate heat generated in the central region of the gallium nitride semiconductor device, the device still has a relatively high temperature in the central region and a relatively low temperature in its edges, that is, the temperature distribution is still not uniform.

SUMMARY

In view of this, embodiments of the present invention are directed to a semiconductor device which is capable of facilitating heat dissipation and thus improving reliability of the semiconductor device Embodiments of the present invention are also directed to a method of manufacturing such a semiconductor device.

According to one or more embodiments of the present invention, there is provided a semiconductor device, comprising an active region and a passive region located outside the active region, wherein the active region comprises a plurality of active region units, and at least one pair of adjacent active region units do not completely overlap in a length direction of the semiconductor device.

In a preferred embodiment, the at least one pair of adjacent active region units partially overlap or do not overlap at all in the length direction of the semiconductor device.

In a preferred embodiment, the at least one pair of adjacent active region units do not completely overlap, e.g., partially overlap, in a width direction of the semiconductor device.

In a preferred embodiment, the plurality of active region units are arranged in two columns or three columns in the length direction of the semiconductor device.

In a preferred embodiment, each of the plurality of active region units is provided with at least one source electrode, at least one gate electrode and at least one drain electrode.

In a preferred embodiment, the passive region is provided with a gate interconnection metal for connecting the gate electrodes in the plurality of active region units together and a drain interconnection metal for connecting the drain electrodes in the plurality of active region units together.

In a preferred embodiment, the semiconductor device further comprises: a ground electrode provided on a back surface of the semiconductor device; and a plurality of first via-holes configured to penetrate the semiconductor device and electrically connect the ground electrode and the source electrodes in the plurality of active region units respectively.

In a preferred embodiment, the semiconductor device further comprises: a ground electrode provided on a back surface of the semiconductor device; a plurality of source interconnection metals disposed in the passive region and connected to the source electrodes in the plurality of active region units respectively; and a plurality of second via-holes configured to penetrate the semiconductor device and electrically connect the ground electrode and the plurality of source interconnection metals respectively.

In a preferred embodiment, the semiconductor device further comprises: a ground electrode provided on a back surface of the semiconductor device; a source interconnection metal disposed in the passive region and connected to the source electrodes in the plurality of active region units via a plurality of air bridges respectively; and a plurality of third via-holes configured to penetrate the semiconductor device and electrically connect the ground electrode and the source interconnection metal.

In a preferred embodiment, the plurality of active region units have a substantially same width.

In a preferred embodiment, the semiconductor device is formed of any one of gallium nitride, aluminum gallium nitride, indium gallium nitride, aluminum indium gallium nitride, gallium arsenide, silicon carbide, diamond, sapphire and silicon or any combination thereof.

According to one or more embodiments of the present invention, there is also provided a method of manufacturing a semiconductor device, comprising forming an active region and a passive region located outside the active region, wherein the active region comprises a plurality of active region units, and at least one pair of adjacent active region units do not completely overlap in a length direction of the semiconductor device.

In a preferred embodiment, the at least one pair of adjacent active region units partially overlap or do not overlap at all in the length direction of the semiconductor device.

In a preferred embodiment, the at least one pair of adjacent active region units do not completely overlap, e.g., partially overlap, in a width direction of the semiconductor device.

In a preferred embodiment, the plurality of active region units are arranged in two columns or three columns in the length direction of the semiconductor device.

In a preferred embodiment, each of the plurality of active region units is provided with at least one source electrode, at least one gate electrode and at least one drain electrode.

In a preferred embodiment, the passive region is provided with a gate interconnection metal for connecting the gate electrodes in the plurality of active region units together and a drain interconnection metal for connecting the drain electrodes in the plurality of active region units together.

In a preferred embodiment, the active region and the passive region are formed by any one of a mesa etching process, an ion implantation process and an oxidation isolation process or any combination thereof.

According to embodiments of the present invention, by arranging a plurality of active region units not completely overlapping in the length direction of the semiconductor device, the area of the passive region is increased, thus the heat dissipation area of the semiconductor device is increased. In this way, the heat dissipation can be facilitated, the internal temperature of the semiconductor device can be reduced, the temperature distribution uniformity inside the semiconductor device can be improved, thus the reliability of the semiconductor device can be improved.

Further, according to embodiments of the present invention, the width-length ratio of the semiconductor device is reduced, the difficulty in subsequent processes such as cutting and packaging is reduced, and the yield of the semiconductor device is improved. Also, the size of the device can be further increased while ensuring performances and reliability of the semiconductor device, so that an output power of the semiconductor device can be increased.

BRIEF DESCRIPTION OF DRAWINGS

These and other aspects will become apparent and more readily appreciated from the following description of the embodiments, taken in conjunction with the accompanying drawings in which.

DETAILED DESCRIPTION

Figure 1:
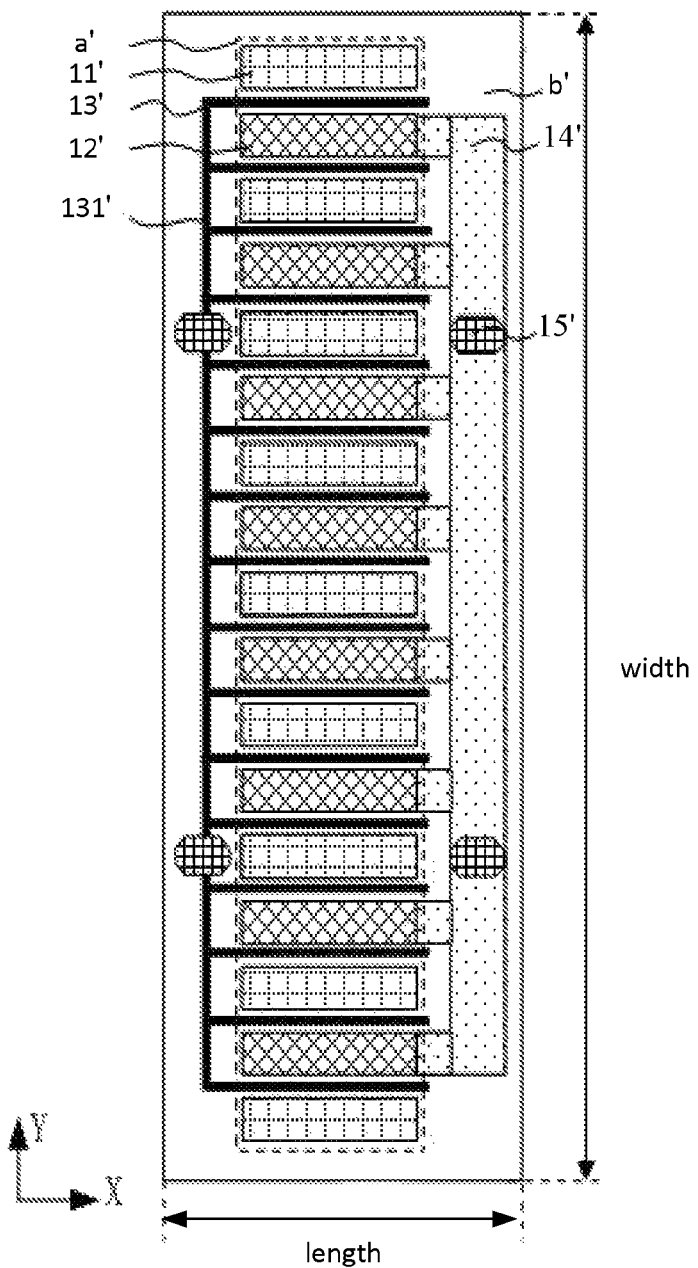
FIG. 1 is a schematic top view illustrating a gallium nitride semiconductor device of the prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter a first embodiment of the present invention will be described in detail with reference to FIGS. 3A and 3B.

Figure 3A:
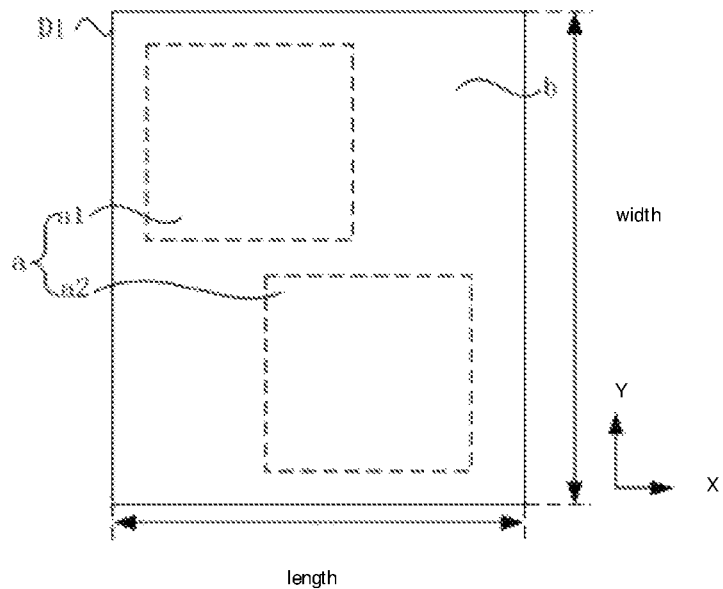
FIGS. 3A and 3B are schematic top views illustrating a semiconductor device according to a first embodiment of the present invention.
Figure 3B:
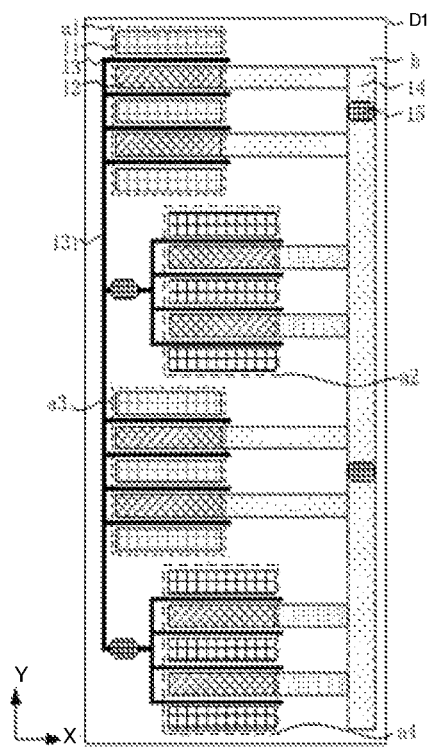

FIGS. 3A and 3B are schematic top views illustrating a semiconductor device according to a first embodiment of the present invention. Referring to FIGS. 3A and 3B, a semiconductor device D1 includes an active region a which is an enclosed region and a passive region b which is located outside the active region a. The active region a includes a plurality of active region units (e.g., two active region units a1 and a2 shown in FIG. 3A or four active region units a1, a2, a3 and a4 shown in FIG. 3B). Each active region unit includes source electrodes 11, gate electrodes 13 and drain electrodes 12. The source electrodes 11, the gate electrodes 13 and the drain electrodes 12 included in each of the active region units form a local multi-finger structure. The source electrodes 11 and the drain electrodes 12 may be ohmic contact electrodes.

The active region a has two-dimensional electron gas, electrons or holes therebelow, and is a working region of the semiconductor device. In contrast, the two-dimensional electron gas, electrons or holes under the passive region b are eliminated or isolated by a mesa etching process, an ion implantation process and/or an oxidation isolation process, thus the passive region b is not a working region. Wires can be disposed inside the passive region b to connect the source electrodes 11, the gate electrodes 13 and the drain electrodes 12 in the active region units so as to form a large semiconductor device.

Specifically, a drain interconnection metal 14 and a gate interconnection metal 131 may be provided in the passive region b. The drain interconnection metal 14 connects the drain electrodes 12 in the active region a, i.e., in the plurality of active region units, together, and the gate interconnection metal 131 connects the gate electrodes 13 in the active region a, i.e., in the plurality of active region units, together, so as to form a large-sized device which can output a high power.

Lead pads 15 may be further provided on the drain interconnection metal 14 and/or the gate interconnection metal 131 to transmit external signals to the semiconductor device D1. The lead pads 15 may be formed of metal. The lead pads 15 electrically connected to the gate electrodes 13 preferably have the same length so that the signals arriving at the gate electrodes 13 have the same phase. Similarly, the lead pads 15 electrically connected to the drain electrodes 12 preferably have the same length so that the signals arriving at the drain electrodes 12 have the same phase.

The semiconductor device D1 may be formed of any one of gallium nitride, aluminum gallium nitride, indium gallium nitride, aluminum indium gallium nitride, gallium arsenide, silicon carbide, diamond, sapphire and silicon, or any combination thereof. Silicon carbide is preferable due to its high thermal conductivity, so that the heat generated in the active region a of the semiconductor device can be transversely transferred to the passive region b with no heating sources therearound, which facilitates heat dissipation and reduces the internal temperature of the device.

As seen from FIGS. 3A and 3B, in the first embodiment, the adjacent active region units partially overlap in a length direction of the semiconductor device. As compared with the prior art shown in FIGS. 1 and 2, it can be seen that in the first embodiment, the plurality of active region units are not aligned in the length direction, but are arranged in two columns which partially overlap in the length direction.

Figure 2:
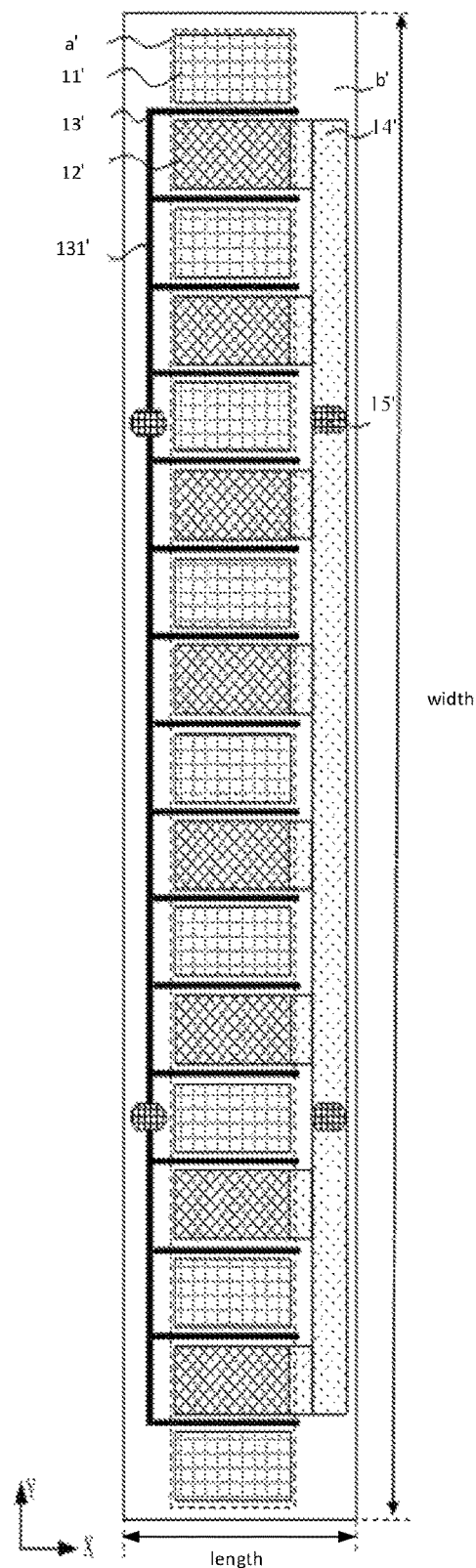
FIG. 2 is a schematic top view illustrating a gallium nitride semiconductor device of the prior art with an increased heat dissipation area.

Further, in the first embodiment, the adjacent active region units do not overlap at all in a width direction of the semiconductor device, that is, the width of the semiconductor device is not changed as compared with the prior art shown in FIGS. 1 and 2.

Herein, the length direction of the semiconductor device is designated as X direction in the figures, i.e., a direction in which the source electrodes 11, the gate electrodes 13 and the drain electrodes 12 are extended in the semiconductor device. The width direction of the semiconductor device is designated as Y direction in the figures, i.e., a direction perpendicular to the X direction in the arrangement plane of the active region a and the passive region b.

Compared with the prior art shown in FIGS. 1 and 2, in the semiconductor device according to the first embodiment of the present invention, by arranging a plurality of active region units not completely overlapping in the length direction of the semiconductor device, the area of the passive region b is increased, thus the heat dissipation area of the semiconductor device is increased. In this way, the heat dissipation can be facilitated, the internal temperature of the semiconductor device can be reduced, the temperature distribution uniformity inside the semiconductor device can be improved, thus the reliability of the semiconductor device can be improved.

Further, compared with the prior art shown in FIG. 2, the arrangement in the first embodiment of the present invention reduces the width-length ratio of the semiconductor device, reduces the difficulty in subsequent processes such as cutting and packaging, and improves the yield of the semiconductor device. Also, the size of the device can be further increased while ensuring performances and reliability of the semiconductor device, so that the output power can be increased.

It is to be noted that the present embodiment is just an illustration of the semiconductor device according to the present invention, and the present invention is not limited thereto. The active region units may have a variety of configurations, for example, each active region unit may include one source electrode, one gate electrode and/or one drain electrode. Alternatively, each active region unit may include a plurality of gate electrodes, a plurality of source electrodes and a plurality of drain electrodes which are repeatedly arranged to form a multi-finger structure.

Hereinafter a second embodiment of the present invention will be described in detail with reference to FIGS. 4A and 4B. The duplicated description on the same or similar elements as those in the first embodiment will not be repeated.

Figure 4A:
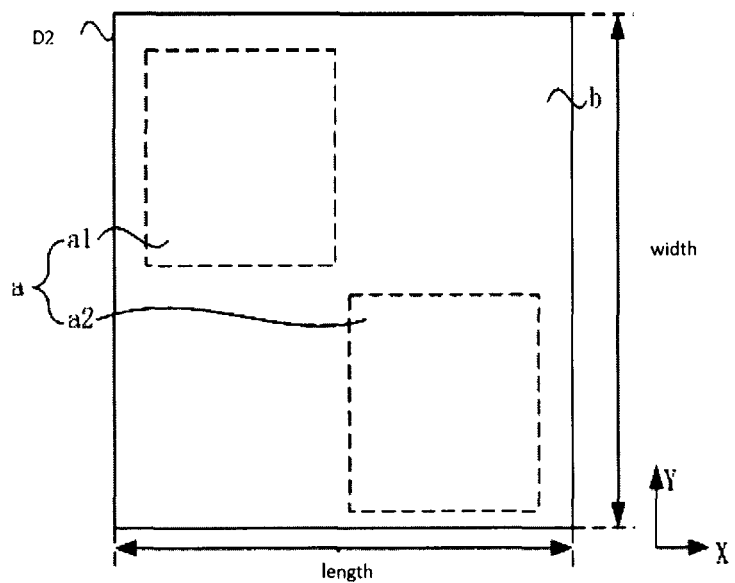
FIGS. 4A and 4B are schematic top views illustrating a semiconductor device according to a second embodiment of the present invention.
Figure 4B:
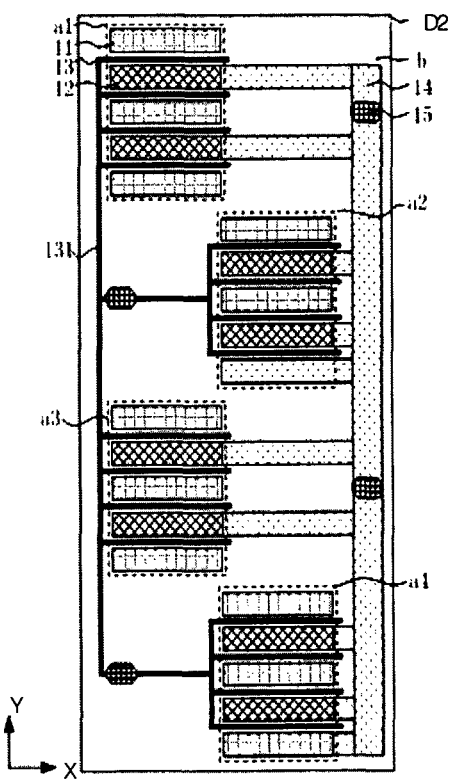

Referring to FIGS. 4A and 4B, different from the first embodiment, in a semiconductor device D2 according to the second embodiment of the present invention, any two adjacent active region units do not overlap at all in the length direction of the semiconductor device. Therefore, the area of the passive region b is further increased and even larger than the area of the active region a, so that the heat generated in the active region a of the semiconductor device can be transversely transferred to the passive region b with no heating sources therearound in time, which facilitates heat dissipation and reduces the internal temperature of the device.

Hereinafter a third embodiment of the present invention will be described in detail with reference to FIGS. 5A and 5B. The duplicated description on the same or similar elements as those in the second embodiment will not be repeated.

Figure 5A:
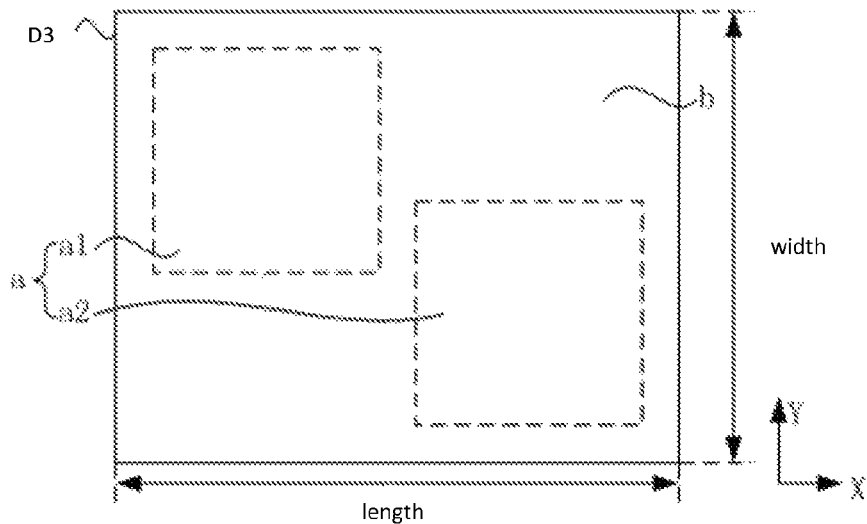
FIGS. 5A and 5B are schematic top views illustrating a semiconductor device according to a third embodiment of the present invention.
Figure 5B:
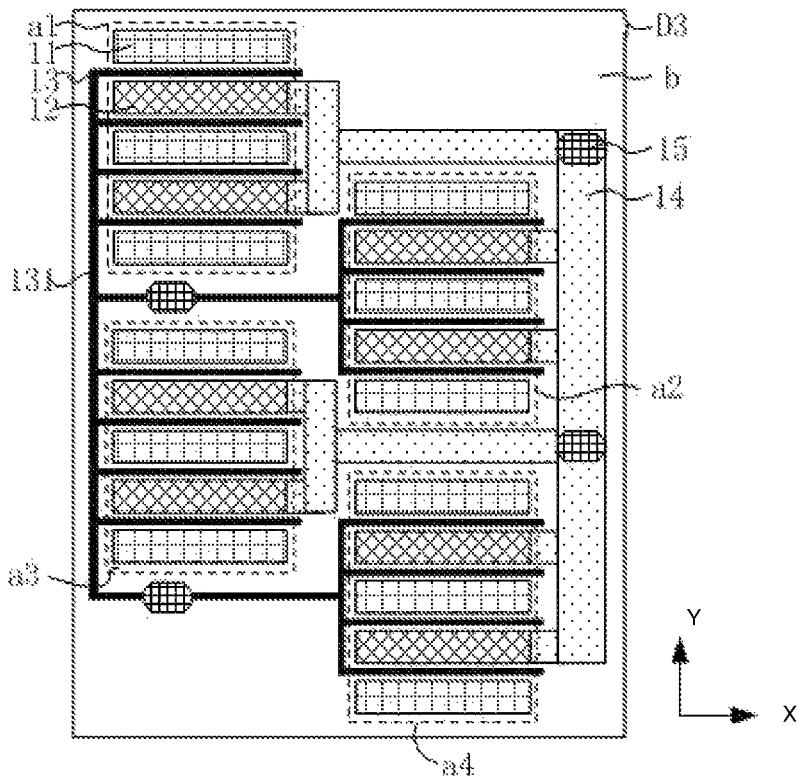

Referring to FIGS. 5A and 5B, different from the second embodiment, in a semiconductor device D3 according to the third embodiment of the present invention, any two adjacent active region units partially overlap in the width direction of the semiconductor device. Therefore, a distance between the two adjacent active region units in the width direction of the semiconductor device is decreased, so that the area of the passive region b can be relatively small in the case where the heat generated by the semiconductor device is not very large, thereby saving the area of the whole semiconductor device and improving the yield of the wafer material.

Hereinafter a fourth embodiment of the present invention will be described in detail with reference to FIGS. 6A and 6B. The duplicated description on the same or similar elements as those in the third embodiment will not be repeated.

Figure 6A:
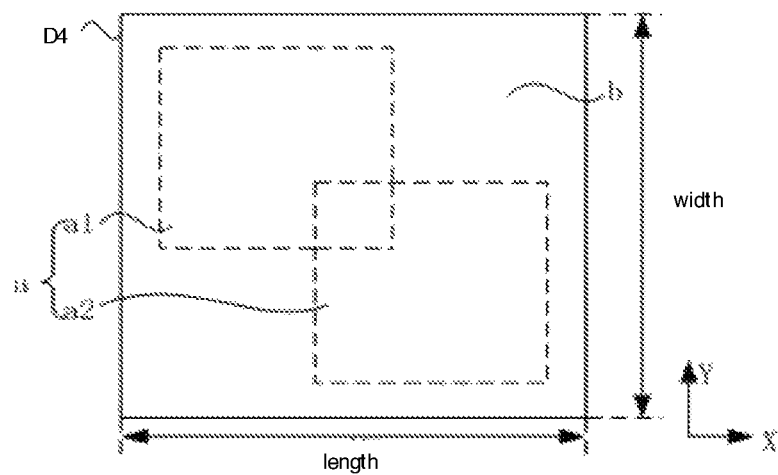
FIGS. 6A and 6B are schematic top views illustrating a semiconductor device according to a fourth embodiment of the present invention.
Figure 6B:
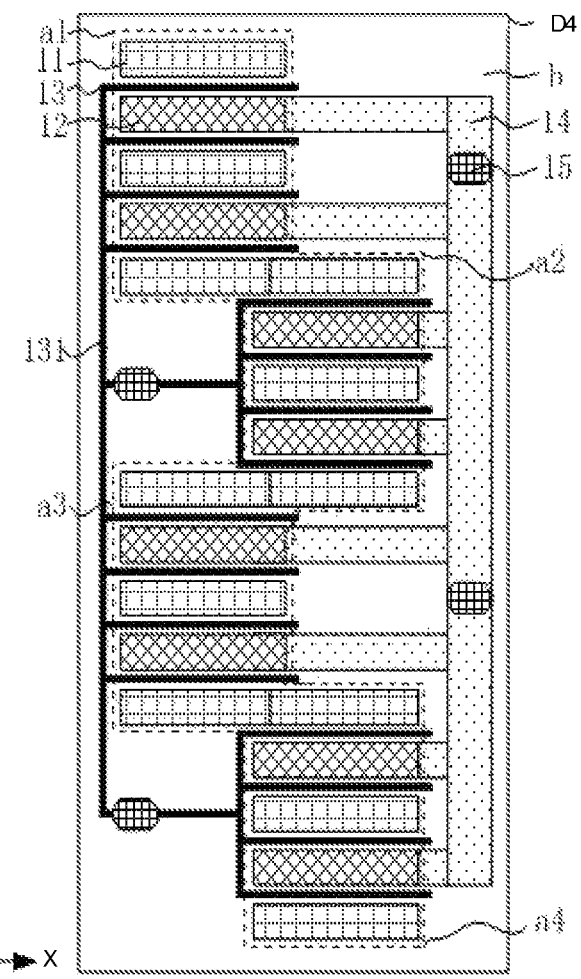

Referring to FIGS. 6A and 6B, different from the third embodiment, in a semiconductor device D4 according to the fourth embodiment of the present invention, any two adjacent active region units in the semiconductor device D4 partially overlap in the length direction of the semiconductor device. In this case, one source electrode 11 in one of the two adjacent active region units (e.g., the active region unit a1 in FIG. 6B) is merged with one source electrode 11 in the other of the two adjacent active region units (e.g., the active region unit a2 in FIG. 6B). Compared with the third embodiment, this arrangement further decreases the area of the passive region b of the semiconductor device, thereby further improving the yield of the wafer material.

Hereinafter a fifth embodiment of the present invention will be described in detail with reference to FIG. 7. The duplicated description on the same or similar elements as those in the first embodiment will not be repeated.

Figure 7:
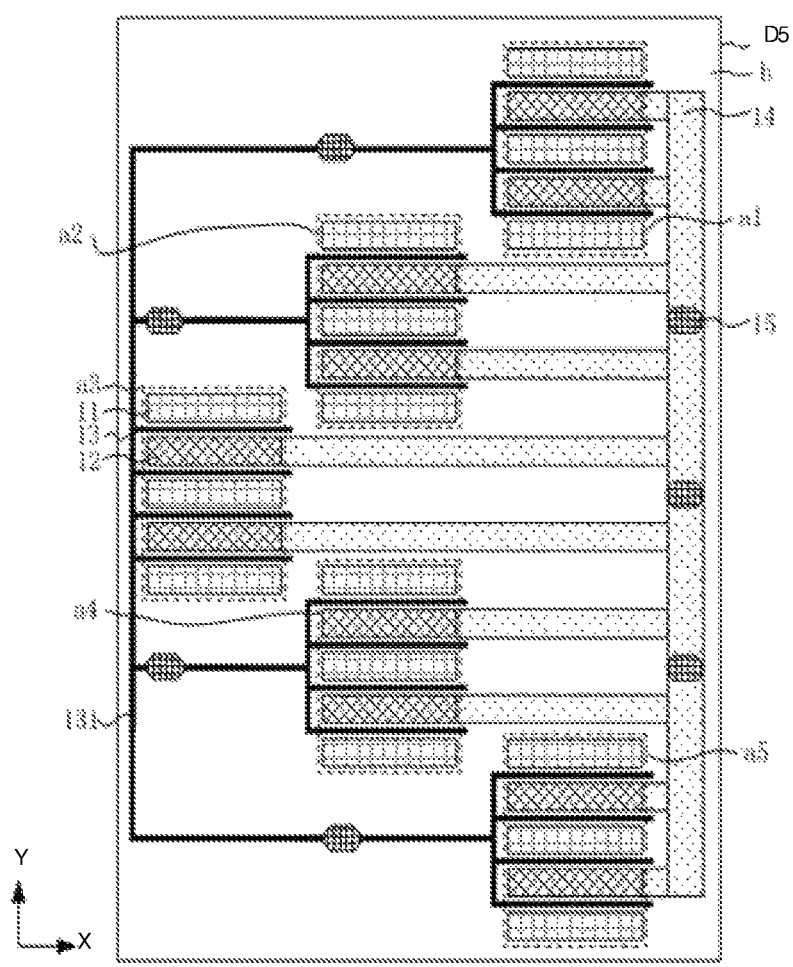
FIG. 7 is a schematic top view illustrating a semiconductor device according to a fifth embodiment of the present invention.

Referring to FIG. 7, different from the first embodiment, in a semiconductor device D5 according to the fifth embodiment of the present invention, the active region units are arranged in three columns which do not overlap at all in the length direction of the semiconductor device. In addition, any two adjacent active region units partially overlap in the width direction of the semiconductor device. In this way, the semiconductor device D5 has a larger length and a larger area, so that the heat dissipation effect is better, the temperature uniformity inside the semiconductor device is further improved, and the width-length ratio of the semiconductor device is further decreased.

It will be appreciated that this is just an example. In other embodiments, the active region units in the semiconductor device may be arranged in four or more columns in the length direction of the semiconductor device.

In the present invention, a ground electrode (not shown) may be further provided on a back surface of the semiconductor device. The ground electrode may be electrically connected to the source electrodes in different ways, which will be described below with reference to FIGS. 8A to 8C.

Figure 8A:
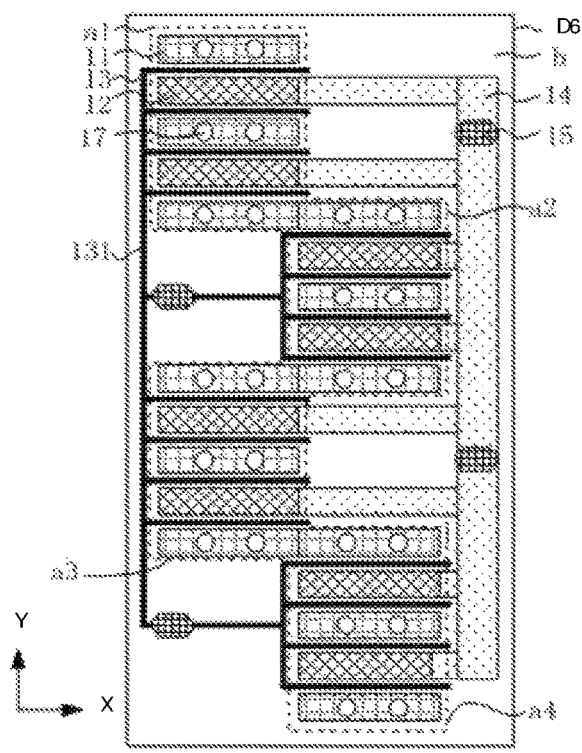
FIG. 8A is a schematic top view illustrating a semiconductor device according to a sixth embodiment of the present invention.

FIG. 8A is a schematic top view illustrating a semiconductor device according to a sixth embodiment of the present invention. The duplicated description on the same or similar elements as those in the first embodiment will not be repeated.

As shown in FIG. 8A, a semiconductor device D6 further includes a plurality of first via-holes 17 configured to penetrate the semiconductor device D6 and respectively electrically connect the ground electrode and the source electrodes 11. That is, the first via-holes 17 are located on the source electrodes 11 in each active region unit of the active region a respectively.

Figure 8B:
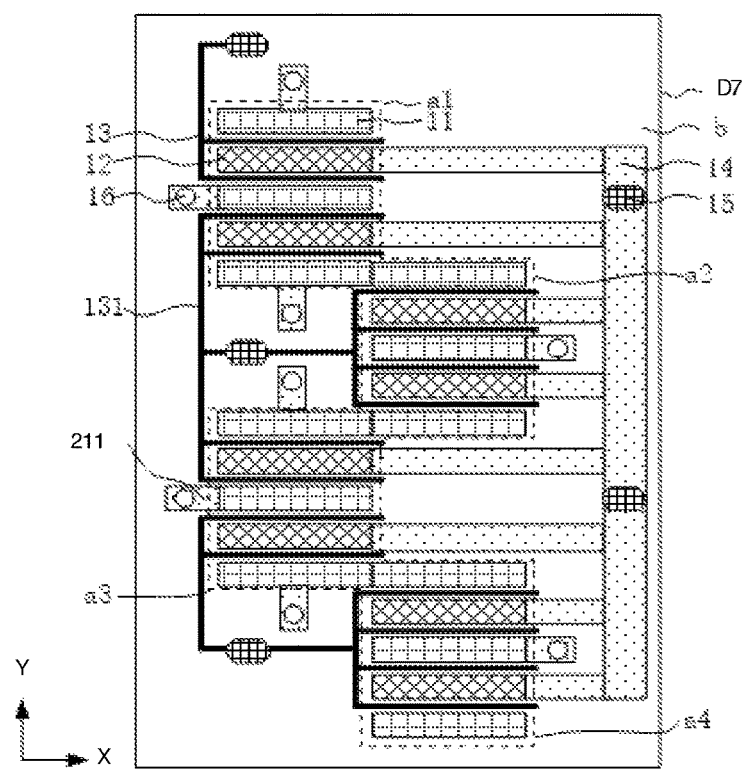
FIG. 8B is a schematic top view illustrating a semiconductor device according to a seventh embodiment of the present invention.

FIG. 8B is a schematic top view illustrating a semiconductor device according to a seventh embodiment of the present invention. The duplicated description on the same or similar elements as those in the first embodiment will not be repeated.

As shown in FIG. 8B, a semiconductor device D7 further includes a plurality of source interconnection metals 211 provided in the passive region b and connected to a plurality of source electrodes 11 in the active region a respectively, and a plurality of second via-holes 16 configured to penetrate the semiconductor device D7 and electrically connect the ground electrode and the plurality of source interconnection metals 211 respectively.

Figure 8C:
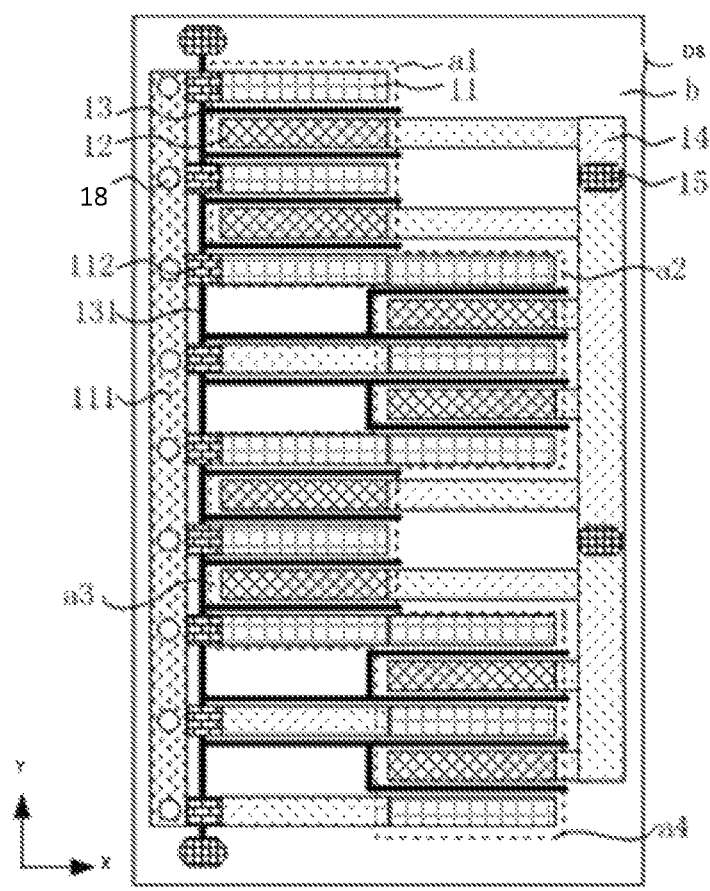
FIG. 8C is a schematic top view illustrating a semiconductor device according to an eighth embodiment of the present invention.

FIG. 8C is a schematic top view illustrating a semiconductor device according to an eighth embodiment of the present invention. The duplicated description on the same or similar elements as those in the first embodiment will not be repeated.

As shown in FIG. 8C, a semiconductor device D8 further includes a source interconnection metal 111 provided in the passive region b and connected to a plurality of source electrodes 11 in the active region a through a plurality of air bridges 112 respectively, and a plurality of third via-holes 18 configured to penetrate the semiconductor device D8 and electrically connect the ground electrode and the source interconnection metal 111. The positions and the number of the third via-holes 18 corresponds to those of the air bridges 112.

As can be seen from FIGS. 3A to 8C, in embodiments of the present invention, the active region a is divided into a plurality of smaller active region units. At least one pair of adjacent active region units do not completely overlap, i.e., partially overlap or do not overlap at all, in the length direction of the semiconductor device. Therefore, compared with the prior art shown in FIGS. 1 and 2, the areas of the active region and the passive region and the width-length ratio can be flexibly changed, thereby improving the heat dissipation effect of the semiconductor device and thus improving the reliability of the semiconductor device.

It will be understood by those skilled in the art that the embodiments described herein are for the purpose of illustration only and are not intended to be limiting of the present invention. The number of the source electrodes 11, the gate electrodes 13 and the drain electrodes 12 in each active region unit, the number of active region units included in the active region, the structure of the semiconductor device structures and the form of wirings are not limited to the embodiments set forth herein. For example, in the foregoing embodiments of the present invention it is described that the widths of the plurality of active region units are substantially the same, but in other embodiments the widths may be different.

Hereinafter a method of manufacturing the semiconductor device according to embodiments of the present invention will be described with reference to FIG. 9.

Figure 9:
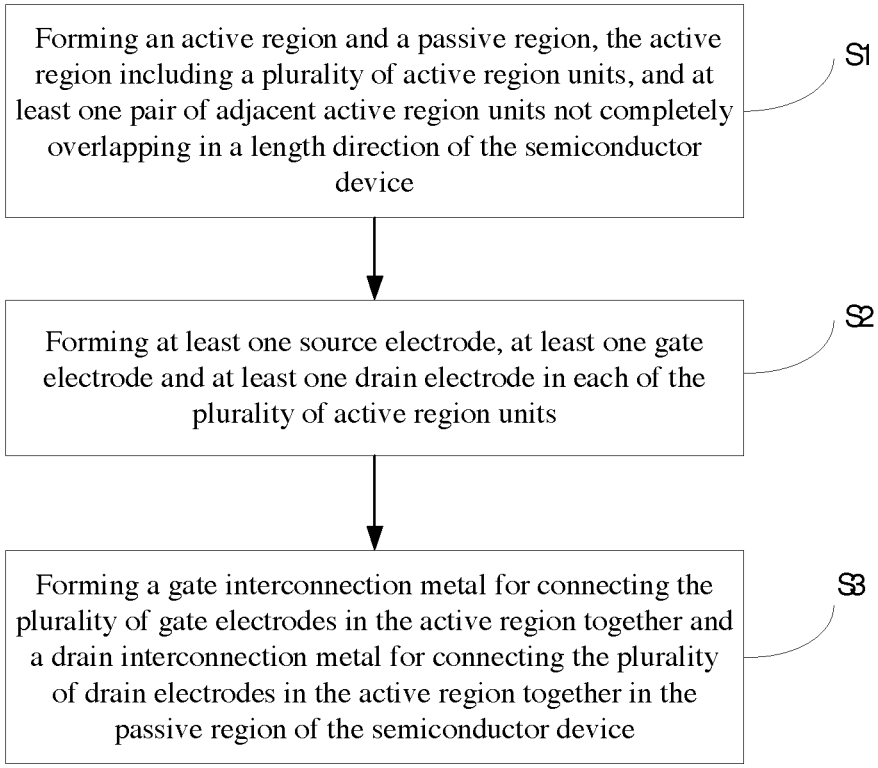
FIG. 9 is a flow chart illustrating a method for manufacturing a semiconductor device.

FIG. 9 is a flow chart illustrating a method for manufacturing a semiconductor device according to embodiments of the present invention.

Referring to FIG. 9, at step S1, an active region which is an enclosed region and a passive region which is located outside the active region are formed. The active region includes a plurality of active region units. At least one pair of adjacent active region units do not completely overlap, i.e., partially overlap or do not overlap at all, in a length direction of the semiconductor device.

The active region has two-dimensional electron gas, electrons or holes therebelow, and is a working region of the semiconductor device. In contrast, the two-dimensional electron gas, electrons or holes under the passive region are eliminated or isolated by a mesa etching process, an ion implantation process and/or an oxidation isolation process, thus the passive region is not a working region. Wires can be disposed inside the passive region to connect the electrodes in the active region so as to form a large semiconductor device.

The area of the active region may be greater than, equal to, or smaller than that of the passive region.

The active region and the passive region of the semiconductor device may be formed using a mesa etching process, an ion implantation process and/or an oxidation isolation process.

In embodiments of the present invention, steps S2 and S3 may be further included. Specifically, at step S2, at least one source electrode, at least one gate electrode and at least one drain electrode are provided in each of the plurality of active region units. At step S3, a gate interconnection metal for connecting the plurality of gate electrodes in the plurality of active region units together and a drain interconnection metal for connecting the plurality of drain electrodes in the plurality of active region units together are formed in the passive region of the front side of the semiconductor device.

Furthermore, lead pads may be further provided on the drain interconnection metal and/or the gate interconnection metal to transmit external signals to the semiconductor device.

Furthermore, a ground electrode may be further provided on a back surface of the semiconductor device. In addition, a plurality of first via-holes configured to penetrate the semiconductor device and respectively electrically connect the ground electrode and the source electrodes can be further provided. Alternatively, a plurality of source interconnection metals provided in the passive region and connected to a plurality of source electrodes in the active region respectively, and a plurality of second via-holes configured to penetrate the semiconductor device and electrically connect the ground electrode and the plurality of source interconnection metals respectively can be further provided. Alternatively, a source interconnection metal provided in the passive region and connected to a plurality of source electrodes in the active region through a plurality of air bridges respectively, and a plurality of third via-holes configured to penetrate the semiconductor device and electrically connect the ground electrode and the source interconnection metal can be further provided. The positions and the number of the third via-holes corresponds to those of the air bridges.

Compared with the prior art shown in FIGS. 1 and 2, in the method of manufacturing the semiconductor device according to embodiments of the present invention, by arranging a plurality of active region units not completely overlapping in the length direction of the semiconductor device, the area of the passive region is increased, thus the heat dissipation area of the semiconductor device is increased. In this way, the heat dissipation can be facilitated, the internal temperature of the semiconductor device can be reduced, the temperature distribution uniformity inside the semiconductor device can be improved, thus the reliability of the semiconductor device can be improved.

Further, compared with the prior art shown in FIG. 2, in the method of manufacturing the semiconductor device according to embodiments of the present invention, the arrangement reduces the width-length ratio of the semiconductor device, reduces the difficulty in subsequent processes such as cutting and packaging, and improves the yield of the semiconductor device. Also, the size of the device can be further increased while ensuring performances and reliability of the semiconductor device, so that the output power can be increased.

It will be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A semiconductor device, comprising:
an active region and a passive region located outside the active region,
wherein the active region comprises N active region units, a length direction of the semiconductor device is designated as X direction, a width direction perpendicular to the X direction is designated as Y direction, and the N active region units are arranged in at least three columns which do not completely overlap in the X direction, and the N active region units are arranged in N rows which do not completely overlap in the Y direction and there is one active region unit in each row, wherein N is greater than or equal to 3.

2. The semiconductor device of claim 1, wherein any two adjacent active region units of the N active region units partially overlap in the X direction of the semiconductor device.

3. The semiconductor device of claim 1, wherein the at least one pair of adjacent active region units do not overlap at all in the length direction of the semiconductor device.

4. The semiconductor device of claim 1, wherein the at least one pair of adjacent active region units do not completely overlap in a width direction of the semiconductor device.

5. The semiconductor device of claim 4, wherein the at least one pair of adjacent active region units partially overlap in the width direction of the semiconductor device.

6. The semiconductor device of claim 1, wherein the plurality of active region units are arranged in two columns or three columns in the length direction of the semiconductor device.

7. The semiconductor device of claim 1, wherein each of the N active region units is provided with at least one source electrode, at least one gate electrode and at least one drain electrode.

8. The semiconductor device of claim 7, wherein the passive region is provided with a gate interconnection metal for connecting the gate electrodes in the N active region units together and a drain interconnection metal for connecting the drain electrodes in the N active region units together.

9. The semiconductor device of claim 7, further comprising:
a ground electrode provided on a back surface of the semiconductor device; and
a plurality of first via-holes configured to penetrate the semiconductor device and electrically connect the ground electrode and the source electrodes in the plurality of active region units respectively.

10. The semiconductor device of claim 7, further comprising:
a ground electrode provided on a back surface of the semiconductor device;
a plurality of source interconnection metals disposed in the passive region and connected to the source electrodes in the plurality of active region units respectively; and
a plurality of second via-holes configured to penetrate the semiconductor device and electrically connect the ground electrode and the plurality of source interconnection metals respectively.

11. The semiconductor device of claim 7, further comprising:
a ground electrode provided on a back surface of the semiconductor device;
a source interconnection metal disposed in the passive region and connected to the source electrodes in the plurality of active region units via a plurality of air bridges respectively; and
a plurality of third via-holes configured to penetrate the semiconductor device and electrically connect the ground electrode and the source interconnection metal.

12. The semiconductor device of claim 1, wherein the N active region units have a substantially same width.

13. The semiconductor device of claim 1, wherein the semiconductor device is formed of any one of gallium nitride, aluminum gallium nitride, indium gallium nitride, aluminum indium gallium nitride, gallium arsenide, silicon carbide, diamond, sapphire and silicon or any combination thereof.

14. A method of manufacturing a semiconductor device, comprising:
  forming an active region and a passive region located outside the active region,
  wherein the active region comprises N active region units, a length direction of the semiconductor device is designated as X direction, a width direction perpendicular to the X direction is designated as Y direction, and the N active region units are arranged in at least three columns which do not completely overlap in the X direction, and the N active region units are arranged in N rows which do not completely overlap in the Y direction and there is one active region unit in each row, wherein N is greater than or equal to 3.

15. The method of claim 14, wherein any two adjacent active region units of the N active region units partially overlap in the X direction of the semiconductor device.

16. The method of claim 14, wherein the at least one pair of adjacent active region units do not overlap at all in the length direction of the semiconductor device.

17. The method of claim 14, wherein the at least one pair of adjacent active region units do not completely overlap in a width direction of the semiconductor device.

18. The method of claim 14, wherein each of the N active region units is provided with at least one source electrode, at least one gate electrode and at least one drain electrode.

19. The method of claim 18, wherein the passive region is provided with a gate interconnection metal for connecting the gate electrodes in the N active region units together and a drain interconnection metal for connecting the drain electrodes in the N active region units together.

20. The method of claim 14, wherein the active region and the passive region are formed by any one of a mesa etching process, an ion implantation process and an oxidation isolation process or any combination thereof.

* * * * *